United States Patent [19]

Baylor

[11] 4,454,483
[45] Jun. 12, 1984

[54] TEMPERATURE COMPENSATION OF AN OSCILLATOR BY FRACTIONAL CYCLE SYNTHESIS

[75] Inventor: John T. Baylor, San Diego, Calif.
[73] Assignee: Cubic Corporation, San Diego, Calif.
[21] Appl. No.: 361,726
[22] Filed: Mar. 25, 1982
[51] Int. Cl.³ .......................... H03L 1/02; H03L 7/08
[52] U.S. Cl. ......................................... 331/11; 331/17; 331/25; 331/176
[58] Field of Search ................... 331/10, 11, 17, 25, 331/66, 176

[56] References Cited

U.S. PATENT DOCUMENTS

| | | | |
|---|---|---|---|
| 3,938,316 | 2/1976 | Morokawa et al. | 331/176 X |
| 4,015,208 | 3/1977 | Hammer et al. | 331/176 X |
| 4,159,622 | 7/1979 | Akahane | 331/176 X |
| 4,297,657 | 10/1981 | Frerking | 331/66 X |

Primary Examiner—Siegfried H. Grimm
Assistant Examiner—David C. Mis
Attorney, Agent, or Firm—Brown & Martin

[57] ABSTRACT

A method for temperature compensating the output of an oscillator circuit and apparatus for performing the method. This method employs fractional cycle synthesis to maintain the output frequency of a voltage-controlled oscillator at a desired value, the reference frequency of the circuit being derived from a crystal oscillator. To calibrate the circuit, the crystal oscillator is cycled in temperature. The frequency output of the crystal oscillator is accurately counted while a digital signal representing temperature is generated by an analog-to-digital converter from a temperature sensor. A signal representing the relationship between crystal frequency and temperature is stored in a memory and is available during actual operation of the oscillator for temperature compensation. During oscillator operation the output of the memory, as it relates to an instantaneous ambient temperature of the crystal, is appropriately treated and then injected into a phase locked loop containing the voltage-controlled oscillator, thereby affecting the input voltage to the oscillator to control the frequency output thereof. The stabilized frequency output of the VCO is offset from the crystal reference frequency and it is this offset that is shifted by very small amounts to provide the desired compensation of the oscillator output.

5 Claims, 8 Drawing Figures

TEMPERATURE COMPENSATION OF AN OSCILLATOR BY FRACTIONAL CYCLE SYNTHESIS

FIELD OF THE INVENTION

This invention relates to oscillators, the frequency of which is compensated for the effects of physical disturbances, and more particularly concerns temperature compensation by means of fractional cycle synthesis of a voltage-controlled oscillator with a crystal oscillator frequency reference.

BACKGROUND OF THE INVENTION

Applications for accurate oscillation sources are innumerable. These include radios, radar, downed aircraft beacons and space borne apparatus, all of which may be subjected to significant temperature variations. It is well known that oscillators, and more specifically crystal oscillators, tend to vary in frequency with changes in ambient temperature. Frequency stability over wide varying temperatures is highly desirable and a number of methods have been devised for effecting such temperature compensation. One satisfactory method for large or relatively expensive installations is to provide an oven which can be very precisely maintained at a desired temperature so that there is substantially no temperature related frequency drift of the crystal oscillator. The amount of space and energy used in such an installation makes this method impractical for many applications.

Another common technique for minimizing the sensitivity of a crystal to temperature variations is to control the angle at which the crystal is cut with respect to its crystallographic axis because the temperature coefficient of a crystal is a function of the angle of cut. However, the degree to which the temperature coefficient may be reduced in this manner is quite limited in that the range of temperature over which this approach is effective is relatively small.

A third technique for frequency stabilization is electronic in character, temperature compensation being effected in an analog manner with the aid of a temperature-sensitive element. This results from the fact that the resonant frequency of a crystal may be varied by varying the magnitude of an external reactance connected in circuit with the crystal. Such methods essentially follow the procedure of sensing the temperature and developing a voltage functionally related to the crystal temperature. This voltage may be amplified and used to bias a voltage variable capacitor or other variable impedance means to pull the crystal to the desired frequency. Since the crystal frequency versus temperature curve is usually non-linear, and may not even be monotonic, the temperature-sensing voltage may require non-linear amplification in order to fit the frequency correction in a piecewise linear manner. Many temperature cycles and many man hours are used up in attempting to fit the circuit characteristics to a particular crystal to accomplish the desired compensation. One disadvantage of the analog control technique is that forcing a crystal to operate at a desired frequency which is unnatural for it at a particular temperature, often termed rubberizing, compromises the long-term stability of the crystal so that its actual frequency output at any particular temperature may not be stable and predictable over a long period of time. Thus the useful crystal life can be shortened by the rubberizing techniques.

Examples of analog compensation to affect the actual frequency of the crystal are disclosed in U.S. Pat. Nos. 3,404,297, 3,713,033, 3,397,367 and 3,719,838.

There are other techniques for obtaining temperature-compensated frequencies. One may be referred to as the variable modulus divider technique, examples of which are disclosed in U.S. Pat. Nos. 3,938,316 and 4,015,208. The circuits disclosed in these patents do not adjust the crystal oscillator frequency but provide other means for achieving the desired compensated frequency output. In the variable modulus divider circuits, the crystal oscillator frequency is divided by a relatively large number which is changed as a function of temperature in incremental steps.

Another patent which provides temperature compensation without adjusting the crystal oscillator is U.S. Pat. No. 4,159,622. This device employs two crystal oscillators at the same frequency. When temperature-caused phase difference occurs between the oscillators, a pulse is added to a divider to advance the frequency rate of the combined output.

SUMMARY OF THE INVENTION

A primary purpose of this invention is to provide a relatively inexpensive precision temperature-compensating circuit and method for providing the desired temperature compensation. This method enables relatively inexpensive crystals to be employed, the major requirement being long-term frequency stability.

The output frequency of the circuit of the present invention is offset from the crystal frequency by only a relatively small number of cycles, in the vicinity of one hundred cycles per million, by means of fractional cycle synthesis, to provide very precise temperature compensation and a very precisely controlled output frequency. Fractional cycle synthesis is a method of offsetting from each other by a relatively slight amount the frequencies of two oscillators on a phase coherent basis. Thus the crystal of the present invention can be chosen for best aging characteristics and other environmental problems and its temperature coefficient is not of major importance. Since the actual operating frequency of the crystal is not disturbed during operation the aging characteristics of the crystal can be employed to best advantage.

The temperature/frequency characteristics of a crystal to be employed in the circuit of this invention may be calibrated by cycling the crystal through one temperature cycle and obtaining digital signals representing the crystal frequency and the ambient temperature of the crystal. This relationship is programmed into a programmable read only memory (PROM) which memory is then employed in the oscillator circuit to provide the control signals necessary to generate a ramp voltage which is injected into a phase locked loop containing a voltage controlled oscillator (VCO), the output of which is the desired frequency. The frequency of the ramp voltage at any given time represents the magnitude of the frequency change necessary to maintain the output of the VCO at the desired frequency in view of a change in the crystal oscillator reference frequency. It should be recognized however that there is always a ramp voltage injected into the phase locked loop which represents the offset frequency designed into the apparatus. It is this offset frequency which is increased or decreased to compensate for the frequency variations of the crystal due to temperature changes.

BRIEF DESCRIPTION OF THE DRAWING

The objects, advantages and features of this invention will be more readily appreciated from the following detailed description when read in conjunction with the accompanying drawing, in which.

DESCRIPTION OF THE PREFERRED EMBODIMENT

Figure 1:
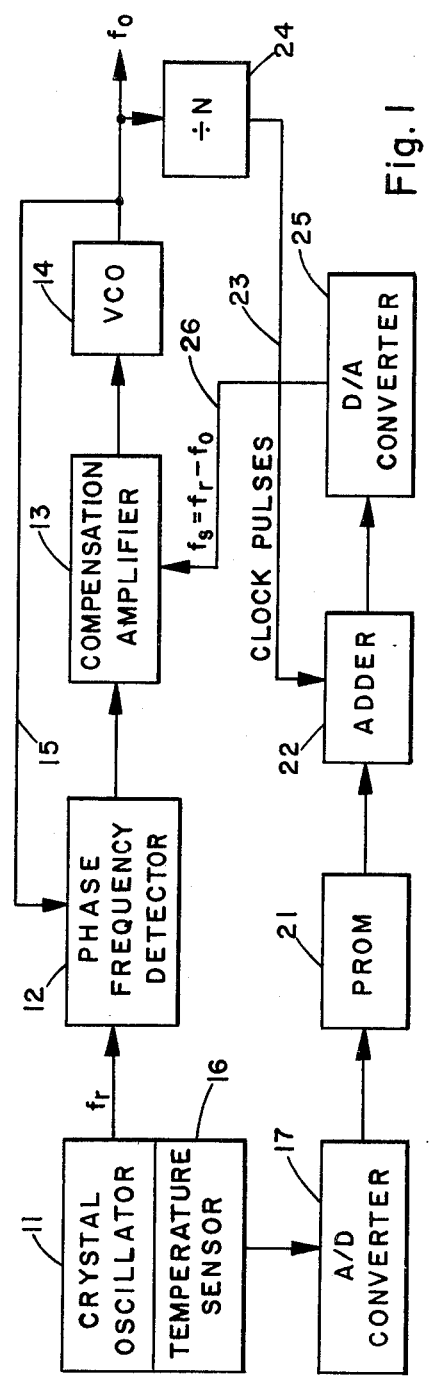
FIG. 1 is a block diagram of the apparatus of the invention.

With reference now to FIG. 1 there is shown the crystal oscillator circuit of the present invention. Reference frequency $f_r$ is provided by a crystal oscillator 11. The general sinusoidal output of the crystal oscillator is applied to phase frequency detector 12, the output of which is fed to compensation amplifier 13 which provides a DC voltage signal to control the frequency output of VCO 14, this frequency being referred to as the output frequency $f_o$. The output of the VCO is fed back to the phase frequency detector 12 by means of line 15, thereby forming a phase locked loop. Without any compensation, this portion of the circuit would operate with $f_o = f_r$ in accordance with well known principles of operation of a phase locked loop.

The temperature compensation portion of the FIG. 1 circuit includes a temperature sensor 16 which, when coupled to analog-to-digital (A/D) converter 17, provides a digital representation of the crystal temperature. It is not necessary that an absolute temperature value be determined, only that there be a distinct digital representation of instantaneous temperature. A programmable read only memory (PROM) 21, which has previously been programmed as discussed hereinbelow, receives the digital output of converter 17 and provides an output signal to adder 22 indicative of the temperature/frequency relationship of the crystal. The output of the adder is triggered in stepwise fashion by the clock pulses provided by line 23 from divider 24 which stems from the stabilized output frequency of the oscillator circuit. The high order bits of the adder are converted to voltage in the digital-to-analog (D/A) converter 25 forming the ramp voltage represented by the wave forms of FIGS. 5-7. It is this ramp voltage which is fed to compensation amplifier 13 over line 26 which offsets the output frequency of the VCO from the frequency of the crystal oscillator. The offset frequency $f_s$ changes inversely with temperature-caused changes of crystal oscillator frequency so that the relationship $f_o = f_r - f_s$ is maintained and where $f_o$ is fixed. At a predetermined reference temperature $T_o$ the crystal oscillator frequency is $f_{r1}$ and provides the basic offset frequency which may increase or decrease as temperature varies. By changing the frequency of the ramp voltage, and consequently the slope of the ramp out of the D/A converter, the phase locked loop is forced to shift phase at a rate equal to the slope of the voltage ramp. At the end of each cycle of the ramp, the voltage is snapped back to that corresponding to 360 degrees away. This has the effect of advancing the phase of the VCO by one cycle. Since frequency is the rate of change of phase, this mechanism advances or retards the frequency output of the phase locked loop by the repetition rate or frequency of the ramp, thereby maintaining stable the output frequency of the VCO.

Figure 3:
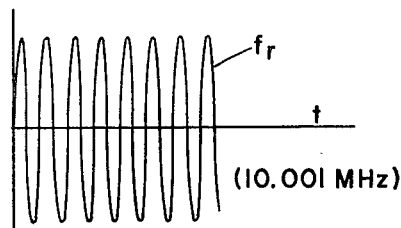
FIG. 3 is a wave form representing the crystal output reference frequency.
Figure 4:
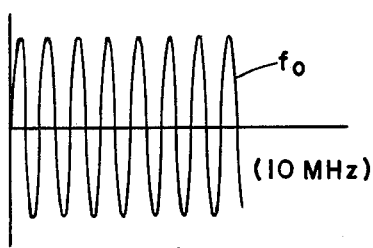
FIG. 4 is a wave form showing the VCO output frequency.
Figure 5:
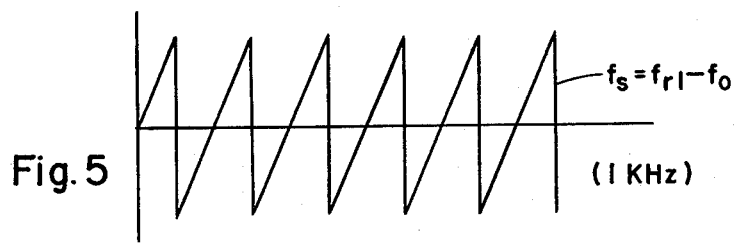
FIG. 5 represents the base offset of the VCO frequency with respect to the crystal frequency.
Figure 6:
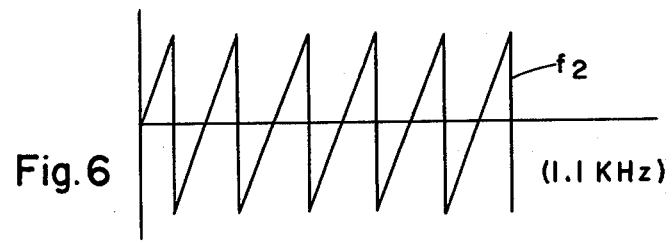
FIG. 6 is a sawtooth wave similar to FIG. 5 but higher in frequency to compensate for temperature differences in the output of the crystal.
Figure 7:
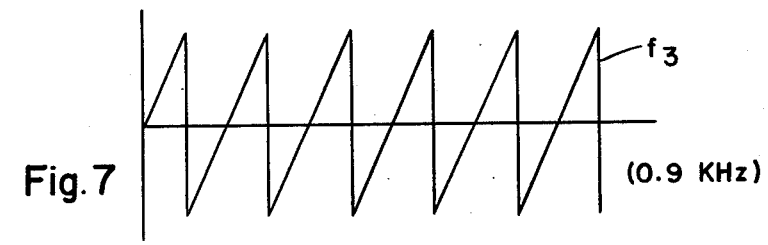
FIG. 7 is another sawtooth wave similar to FIG. 5 but lower in frequency to compensate for a different temperature-caused variation in the crystal output.

The wave forms of FIGS. 3-7 are not intended to represent actual frequencies, and the relationships between them are shown exaggerated for expository purposes. For example, the actual desired frequency output $f_o$ of the VCO is assumed to be 10 MHz (FIG. 4) while the base crystal frequency $f_{r1}$ is 10.001 MHz (FIG. 3). Further, the sawtooth wave of FIG. 5 is assumed to be 1 KHz, that of FIG. 6 is 1.1 KHz and FIG. 7 is 0.9 KHz. These are representative numbers only and the invention is not in any way limited to such frequency values or relationships.

If we assume that the base or reference frequency $f_{r1}$ of the crystal at some reference temperature $T_o$ is 10.001 MHz, we can choose the output frequency of the VCO to be precisely 10 MHz and the offset is 1 KHz. This would mean that the frequency of the ramp voltage of FIG. 5, which is the output of the D/A converter at temperature $T_o$ is 1 KHz, that is, one hundred cycles per million of frequency. From this frequency value, the output frequency of the crystal oscillator may vary to higher or lower frequencies with temperature changes. For example, it may be assumed that at temperature $T_1$ the frequency of crystal oscillator 11 decreases. In that event, as shown in FIG. 6, the frequency $f_2$ of the ramp voltage might increase to 1.1 KHz to compensate the VCO for the change in the crystal oscillator frequency. On the other hand, at temperature $T_2$, the frequency of the crystal oscillator might increase. In that event, the ramp voltage decreases as shown in FIG. 7 so that the output of the VCO remains the same but the difference between that output and the crystal oscillator frequency is diminished so that the compensation required by the temperature changes is in the other direction, that is, the offset frequency $f_3$ between $f_o$ and $f_r$ is less than that of FIG. 5 or 6.

Figure 2:
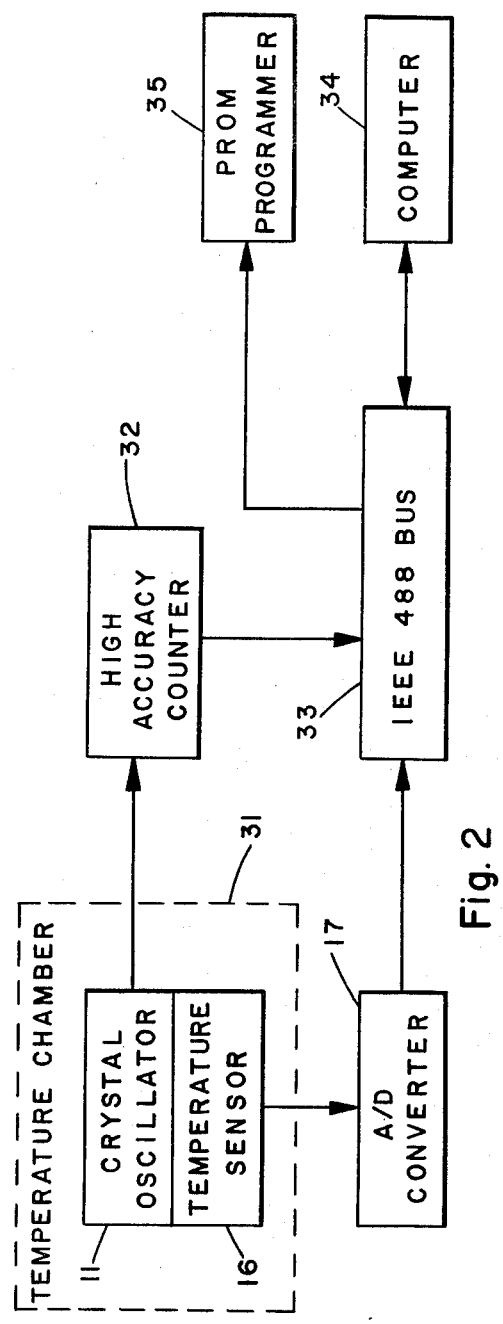
FIG. 2 is a block diagram of the apparatus for calibrating the crystal oscillator with respect to temperature.

With respect to FIG. 2, the method by which the crystal oscillator is calibrated and the PROM is programmed is shown. The temperature gradient between the temperature sensor and the crystal oscillator can be minimized by putting the sensor inside the crystal housing coupled as closely as possible to the crystal. This combination is then placed in a temperature chamber 31 so that the crystal can be cycled in temperature. Sensor 16 in this calibration procedure is coupled to A/D converter 17 to provide a digital output representative of instantaneous temperature. Simultaneously, the output of crystal oscillator 11 is applied to high accuracy counter 32. By means of IEEE 488 BUS 33, the digital representation of temperature and the precise frequency of the crystal oscillator is applied to computer 34 which generates an appropriate digital word for each temperature sampled. By properly choosing the temperature sensor and the A/D converter, this calibration procedure may be as fine as desired for any practical purpose, that is, the temperature and frequency relationship may be sampled at one degree intervals, or at greater or lesser temperature steps.

Figure 8:
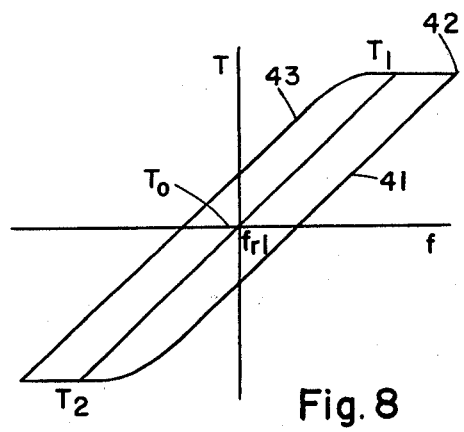
FIG. 8 shows the hysteresis loop of the crystal temperature employed in calibrating the crystal frequency with respect to temperature.

When the crystal oscillator has been cycled through the desired temperature range, for example, $-50°$ to $+100°$ C., the digital representations of the temperature/frequency relationships generated by the computer are fed seriatim into the PROM programmer 35, each one being individually burned in for permanent programming purposes. With respect to the crystal temperature, thermal gradients can either limit the rate of change of the temperature applied to the oscillator during calibration, or the data can be taken at a fixed temperature ramp and the measured frequencies for a given sensor voltage can be averaged. For example, FIG. 8 shows the hysteresis loop of the crystal temperature. As the actual temperature chamber increases from temperature $T_o$ to $T_1$, the temperature of the crystal itself lags to a certain extent as indicated by curve 41. Eventually the temperature of the crystal will equal that of the chamber at $T_1$ as indicated by point 42. As the temperature moves back down from $T_1$ toward $T_o$ and finally to a lower temperature $T_2$, the temperature of the crystal continues to lag that of the chamber as indicated by curve 43. Since the temperature of the crystal may not precisely equal that of the temperature chamber, the programming is done by averaging the frequencies matched against temperature sensor values as the temperature increases and as it decreases, that is, the frequencies corresponding to curves 41 and 43 in FIG. 8. Thus when the temperature sensor, during operation of the oscillator, provides an output indicative of a certain temperature, the PROM will accurately provide an output relating that temperature to the oscillator frequency.

It should be observed that for either calibration or operation of the oscillator circuit, the actual value of the temperature need not be measured. The temperature sensor should be monotonic but it need not be linear. All that is required for the calibration process is to relate two numbers: the sensor output and the crystal oscillator frequency.

As stated previously, the clock rate at which the adder is updated is derived from the output of the VCO, the frequency which is stabilized by this apparatus. Therefore, the number of bits in the adder and the PROM is determined by the minimum offset frequency. If the crystal and the cut are chosen so that the frequency of the crystal is always offset from the desired frequency, then the number of bits in the adder and the PROM can be minimized. If the adder has an 8-bit capacity, there is a phase least significant bit of pi/128 or about 1.41 degrees. If this proves inadequate in fineness of resolution, the number of bits converted can easily be increased.

In operation, the output voltage from the temperature sensor is digitized. This number is used as the address for the PROM. The PROM output is the increment to be summed to get the required ramp output.

While this is an open loop correction for temperature variations, it is very precise and maintains the desired frequency very accurately. By not rubberizing the crystal and allowing it to run freely within this circuit, one need only choose a crystal cut which provides long-term stability and predictable reaction to temperature changes and the designer is not particularly concerned with the amount of temperature induced frequency variations or whether or not those variations are linear, monotonic, or are in any way regular. The use of this digital compensation circuit makes it possible to compensate any ordinary crystal oscillator to the accuracy of laboratory standards both inexpensively and easily, with only a single calibration run being necessary.

I claim:

1. A method for temperature compensation of an oscillator circuit having a crystal oscillator reference frequency $f_r$, said reference frequency having a base value $f_{r1}$ at a reference temperature $T_o$, the output of said circuit being a predetermined stable frequency $f_o$, said method comprising the steps of:

cycling said crystal oscillator through a predetermined range of temperatures;

periodically sensing the instantaneous temperature of said crystal oscillator and providing an analog signal representing the temperature;

converting said analog signal to a digital signal;

detecting the instantaneous output frequency of said crystal oscillator for each said instantaneous temperature value and providing a digital signal representing said frequency;

feeding said digital temperature signal and said digital frequency signal into a computer;

generating a digital signal in said computer representing the instantaneous correlation between each said temperature and frequency signal;

recording said correlation signals in a programmable read only memory (PROM); then connecting said crystal oscillator to an oscillator circuit comprising a phase frequency detector, a compensation amplifier and a voltage-controlled oscillator (VCO) connected together in a phase locked loop configuration, the output of said VCO being the predetermined stable compensated frequency $f_o$;

producing a digital signal representing the instantaneous temperature of said crystal oscillator;

addressing said PROM with said digital temperature signal to produce an output representing the frequency of said crystal oscillator at that temperature;

converting said PROM output signal to an analog signal in the form of a ramp voltage; and feeding said ramp voltage to said compensation amplifier to offset the circuit output frequency of said VCO by the frequency $f_s$ of said ramp voltage, the frequency of said ramp voltage having a predetermined value at temperature $T_o$ and changing inversely with temperature-caused changes of the crystal oscillator frequency to maintain the relationship $f_o = f_r - f_s$ where $f_o$ is fixed.

2. The method recited in claim 1 wherein said PROM output signal converting step comprises:

feeding the output of said PROM to an adder;

deriving clock pulses from the stabilized output of said VCO; and triggering the output of said adder in stepwise fashion by said clock pulses, the thus triggered output of said adder being converted to said ramp voltage in a digital-to-analog (D/A) converter.

3. A temperature compensation oscillator circuit comprising:

a crystal oscillator providing a reference frequency $f_r$;

a phase frequency detector connected to the output of said crystal oscillator;

a compensation amplifier connected to the output of said phase frequency detector;

a voltage-controlled oscillator (VCO) connected to the output of said compensation amplifier, the output of said VCO being a predetermined stable frequency $f_o$;

means for feeding back the output of said VCO to said phase frequency detector to thereby form a phase locked loop;

a temperature sensor coupled to said crystal oscillator and providing an output signal representing the instantaneous temperature of said crystal oscillator;

an analog-to-digital (A/D) converter connected to said temperature sensor to provide a digital signal representative of said instantaneous temperature;

a programmable read only member (PROM) connected to said A/D converter, said PROM being preprogrammed to provide a digital output representative of the frequency of said crystal oscillator at the sensed temperature;

means to provide a ramp voltage having a frequency $f_s$ dependent upon said PROM output; and means to inject said ramp voltage into said phase locked loop at said compensation amplifier to thereby maintain said VCO at the predetermined frequency $f_o$, compensated for temperature variations, where $f_o = f_r - f_s$.

4. The oscillator recited in claim 3 wherein said means for providing and injecting said ramp voltage comprises:

an adder receiving the digital output from said PROM;

means for providing clock pulses to said adder to trigger the output of said adder in stepwise fashion; and a digital-to-analog (D/A) converter receiving the output of said adder and converting said adder output to said ramp voltage dependent in frequency upon the output from said PROM which in turn is temperature sensitive.

5. Apparatus for programming said PROM with respect to said crystal oscillator of claim 3, said apparatus comprising:

said crystal oscillator;

said temperature sensor;

said A/D converter;

a counter connected to said crystal oscillator for providing a signal representing the instantaneous frequency of said crystal oscillator;

means for cycling said crystal oscillator through a predetermined range of temperatures;

computer means;

means for connecting the digital signals from said A/D converter and said counter respectively representing temperature and corresponding frequency with said computer means to generate a digital output for each instantaneous temperature sampled; and PROM programming means coupled between said computer means and said PROM to thereby program into said PROM a signal representing a specific frequency for each sampled temperature.

* * * * *